United States Patent [19]
Agarwal et al.

[11] Patent Number: 6,055,203
[45] Date of Patent: Apr. 25, 2000

[54] ROW DECODER

[75] Inventors: Manu Agarwal, Santa Clara; Manik Advani, Fremont; Reza Kazerounian, Alameda, all of Calif.

[73] Assignee: Waferscale Integration, Fremont, Calif.

[21] Appl. No.: 08/974,007

[22] Filed: Nov. 19, 1997

[51] Int. Cl.[7] .................................. G11C 8/00; G11C 7/00
[52] U.S. Cl. ...................... 365/230.06; 365/203; 365/204
[58] Field of Search ......................... 365/230.03, 230.06, 365/189.05, 203, 204

[56] References Cited

U.S. PATENT DOCUMENTS

| | | | |
|---|---|---|---|
| 4,259,731 | 3/1981 | Moench | 365/230.06 |
| 4,360,902 | 11/1982 | Proebsting | 365/230.06 |
| 4,401,903 | 8/1983 | Iizuka | 365/230.06 |
| 4,724,341 | 2/1988 | Yamada et al. | 307/449 |
| 4,788,457 | 11/1988 | Mashiko et al. | 365/230.6 |
| 4,798,977 | 1/1989 | Sakui et al. | 307/446 |
| 4,843,261 | 6/1989 | Chappell et al. | 365/230.06 |
| 5,018,107 | 5/1991 | Yoshida | 365/230.06 |
| 5,282,175 | 1/1994 | Fujita et al. | 365/230.06 |
| 5,416,741 | 5/1995 | Ohsawa | 365/201 |
| 5,446,859 | 8/1995 | Shin et al. | 365/230.03 |
| 5,519,665 | 5/1996 | Chishiki | 365/230.06 |
| 5,528,540 | 6/1996 | Shibata et al. | 365/230.06 |
| 5,602,796 | 2/1997 | Sugio | 365/230.06 |
| 5,610,872 | 3/1997 | Toda | 365/230.06 |
| 5,612,924 | 3/1997 | Miyamoto | 365/230.06 |
| 5,633,832 | 5/1997 | Patel et al. | 365/230.06 |
| 5,640,359 | 6/1997 | Suzuki et al. | 365/230.06 |
| 5,761,135 | 6/1998 | Lee | 365/230.06 |

OTHER PUBLICATIONS

S.B. Ali et al., "A50–ns 256K CMOS Split–Gate EPROM", *IEEE Journal of Solid State Circuits*, vol. 23, No. 1, pp. 79–85, Feb. 1988.

Katsuyuki Sato et al., "a–4Mb Pseudo SRAM Operating at 2.6 ± IV with 3–$\mu$A Data Retention Current", *IEEE Journal of Solid–State Circuits*, vol. 26, No. 11, pp. 1556–1562, Nov. 1991.

R. Shirota et al., "An Accurate Model of Subbreakdown Due to Band–To–Band Tunneling and its Application", *IEDM Technical Digest*, pp. 26–27, Dec. 1988.

Tomohisa Wada et al., "Simple Noise Model and Low–Noise Data–Output Buffer for Ultrahigh–Speed Memories", *IEEE Journal of Solid–State Circuits*, vol. 25, No. 6, pp. 1586–1588, Dec. 1990.

Manabu Ando et al., "A 0.1–$\mu$A Standby Current, Ground–Bounce–Immune 1–Mbit CMOS SRAM", *IEEE Journal of Solid–State Circuits*, vol. 24, No. 6, pp. 1708–1710, Dec. 1989.

Douseki et al., "Fast–Access BiCMOS SRAM Architecture with a $V_{ss}$ Generator" *IEEE Journal of Solid–State Circuits*, vol. 26, No. 4, pp. 513–517, Apr. 1991.

*Primary Examiner*—Trong Phan
*Attorney, Agent, or Firm*—Skjerven, Morril, MacPherson, Franklin & Friel LLP

[57] ABSTRACT

A row decoder for controlling a plurality of selectable word-lines has one control line per block of N word-lines, K select lines, at least one disable line and one word-line driver per word-line. Each control line is activatable during a charge period and during an initial portion of a discharge period. Each select line is selectably high during the charge period. The disable line is active during the discharge period. Each driver includes an access transistor and a discharge transistor. The access transistor is located at one end of its word-line and the discharge transistor is connected at the other end. The access transistor is controlled by one control line and is connected between one select line and the word-line. The discharge transistor is controlled by one disable signal and is connected between the word-line and a ground supply.

10 Claims, 8 Drawing Sheets

ROW DECODER

FIELD OF THE INVENTION

The present invention relates to memory units in general and to word-line decoders for such memory units in particular.

BACKGROUND OF THE INVENTION

Memory units, such as electrically programmable read only memory (EPROM) arrays, electrically erasable programmable read only memory (EEPROM) arrays, flash EEPROM (FLASH) arrays, self-timed random access memory (SRAM) arrays, and dynamic random access memory (DRAM) arrays, are formed of arrays of individually accessible storage units, organized into rows of data attached to a "word-line".

The memory array has an associated X or row decoder unit which, when memory cell must be accessed (for reading, writing or programming purposes), receives an address signal indicating the desired memory cell. The X decoder decodes the address signal to select the unique word-line associated with the desired memory cell. For each word line to be activated, the X decoder typically first deselects (i.e. discharges) the previously selected word line and selects the word line to be activated (i.e. charges it).

X decoders can either be clocked or unclocked. U.S. Pat. No. 4,843,261 to Chappell et al. describes one clocked X decoder. An unclocked architecture deselects the previously selected word line while selecting the newly selected word line. A clocked architecture, such as the one shown in FIG. 1 discussed hereinbelow, utilizes less space than an unclocked architecture (and is, therefore, generally more desirable); however, clocked architectures perform the selection and deselection operations in series with each other. Thus, in clocked architectures, the deselection operation must be fully completed before initiating the selection operation.

The time required for deselection or selection depends on the time constant (the "RC" delay) of the word lines. The RC delay is a function of the resistance (R) and capacitance (C) of each word line, both of which are functions of the cross-sectional area and length of each word line. It is noted that, the larger the RC delay is, the longer it takes to discharge or charge the word line.

For low and medium density memory arrays 10, the word lines are of a length such that their RC delay is relatively low. Thus, the time required to deselect and then select, which occurs each time the word line changes, is acceptable. However, for high density memory arrays, the word lines become quite long and, as a result, have an increased RC delay. Every X nanoseconds increased RC delay causes a 2X increased word line access time (comprised of deselection and selection), which can be unacceptably long.

U.S. patent application Ser. No. 08/634,282, entitled "A Row Decoder Having Triple Transistor Word-Line Drivers" and assigned to the common assignees of the present invention, is incorporated herein by reference. The row decoder of U.S. application Ser. No. 08/634,282 is shown in FIG. 1, to which reference is now made.

The row decoder of FIG. 1 includes pre-decoders 10 which receive the addresses to be accessed, dual supply predecoders 12 capable of delivering both conventional voltages Vcc and high voltages Vpp, a plurality of main decoders 14 each associated with isolation elements 15, and a multiplicity of word-line drivers, one per word-line and K per main decoder 14. Each word-line driver includes one p-channel, charging transistor 20 and one discharging transistor 30 on one side of the word line and one n-channel, discharging transistor 22, on the opposite side of the word-line, labeled 24. Each main decoder 14 supplies a control line Fx (where x ranges from 0 to J) to a block of integrated word-line drivers which, in response, control their associated word-lines 24.

The dual-supply predecoders 12 are connected through select lines Ry (where y ranges from 0 to K) to each block of word-line drivers. The select lines Ry carry the voltage (Vcc for reading and Vpp for programming) to be provided to the selected word-line 24.

The discharging transistors 22 are controlled by a row decoder disable line, labeled "DISABLE", which is a clocked signal active during deselection periods. The DISABLE signal is also provided to predecoders 10 for disabling the control lines Fx, and thus the charging transistors 20, during deselection.

Discharging transistors 30 are n-channel transistors controlled by their respective Fx signal. When the DISABLE signal becomes active, it directly activates the discharging transistors 22 on the far end of the word lines 24, it causes the Fx control lines to disable the p-channel charging transistors 20 and to activate the n-channel discharging transistors 30. Thus, each word line 24 is discharged through two discharging transistors, 22 and 30.

The spatial separation of discharging transistors 22 and 30 provides two separate discharge paths for the charge on the relevant word-line. The two separate discharge paths, in effect, divide each word line in two. Thus, for discharging, the RC delay of the word line is that of a word line of half the length. The result is that the two discharging transistors 22 and 30 discharge, by a factor of 4, more effectively than would a single discharging transistor 22 or 30 of almost any size at only one end of the word line.

SUMMARY OF THE PRESENT INVENTION

The present invention is a row decoder with word-line drivers whose charging transistor also functions as a discharging device.

There is therefore provided, in accordance with a preferred embodiment of the present invention, a row decoder for controlling a plurality of selectable word-lines which has one main decoder per block of N word-lines, K select decoders select lines, at least one discharge decoder and one word-line driver per word-line. Each main decoder activates a control line during a charge period and during an initial portion of a discharge period. Each select decoder selectably provides a high voltage to its associated select line during the charge period and a low voltage during most of the discharge period. The discharge decoder(s) activates its disable line at least during the discharge period.

Each driver includes an access transistor and a discharge transistor. The access transistor is located at one end of its word-line and the discharge transistor is connected at the other end. The access transistor is controlled by one control line and is connected between one select line and the word-line. The discharge transistor is controlled by one disable signal and is connected between the word-line and a ground supply.

Moreover, in accordance with a preferred embodiment of the present invention, the discharge decoder ensures that word-lines which neighbor a selected word-line have generally no charge on them during said charge period.

Further, in accordance with a preferred embodiment of the present invention, there are M discharge decoders each connected to its own disable line which, in turn, is connected to every Mth word-line. However, the M disable lines are not connected to the same word-lines. At the end of the discharge period, the M discharge decoders deactivate only the disable line connected to a currently selected word-line.

Still further, in accordance with a preferred embodiment of the present invention, the select decoder is connected to an RSTROBE strobe line and the discharge decoders are connected to a DSTROBE strobe line. The strobe lines control the changes in voltage on the select and disable lines, respectively. The RSTROBE strobe line responds to an address signal at the same time as the DSTROBE strobe line but returns to its previous state before the DSTROBE strobe line does.

Additionally, in accordance with a preferred embodiment of the present invention, the charge period begins before the discharge period ends.

The present invention also incorporates a single transistor word-line driver which charges and discharges a word-line. In accordance with a preferred embodiment of the present invention, the single transistor is located at one end of the word-line, is controlled by a control line and is connected between a select line and the word-line, wherein the control line carries a control signal which is active during a charge period and during a portion of a discharge period and the select line carries a voltage which is high during the charge period and low during the discharge period.

The present invention also incorporates a method of operating a single transistor word-line driver, the driver being controlled by a control line and connected between a select line and a word-line. The method includes the steps of activating the single transistor during a charge period and providing a high voltage on the select line, thereby to charge the word-line with voltage from the select line and activating the single transistor during a discharge period and providing a low voltage on the select line, thereby to discharge the word-line towards the select line.

Finally, the present invention also incorporates a method of operating a dual transistor word-line driver, the driver having an access transistor which is controlled by a control line and connected between a select line and a beginning of a word-line and a discharge transistor which is controlled by a disable line and connected between an end of the word-line and a ground supply. The method includes the steps of activating the access transistor during a charge period and providing a high voltage on the select line, thereby to charge the word-line with voltage from the select line, and activating the access transistor during a first portion of a discharge period and providing a low voltage on the select line while also activating the discharge transistor during all of the discharge period thereby to discharge the word-line towards the select line, during the first portion, and towards the ground supply during all of the discharge period.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
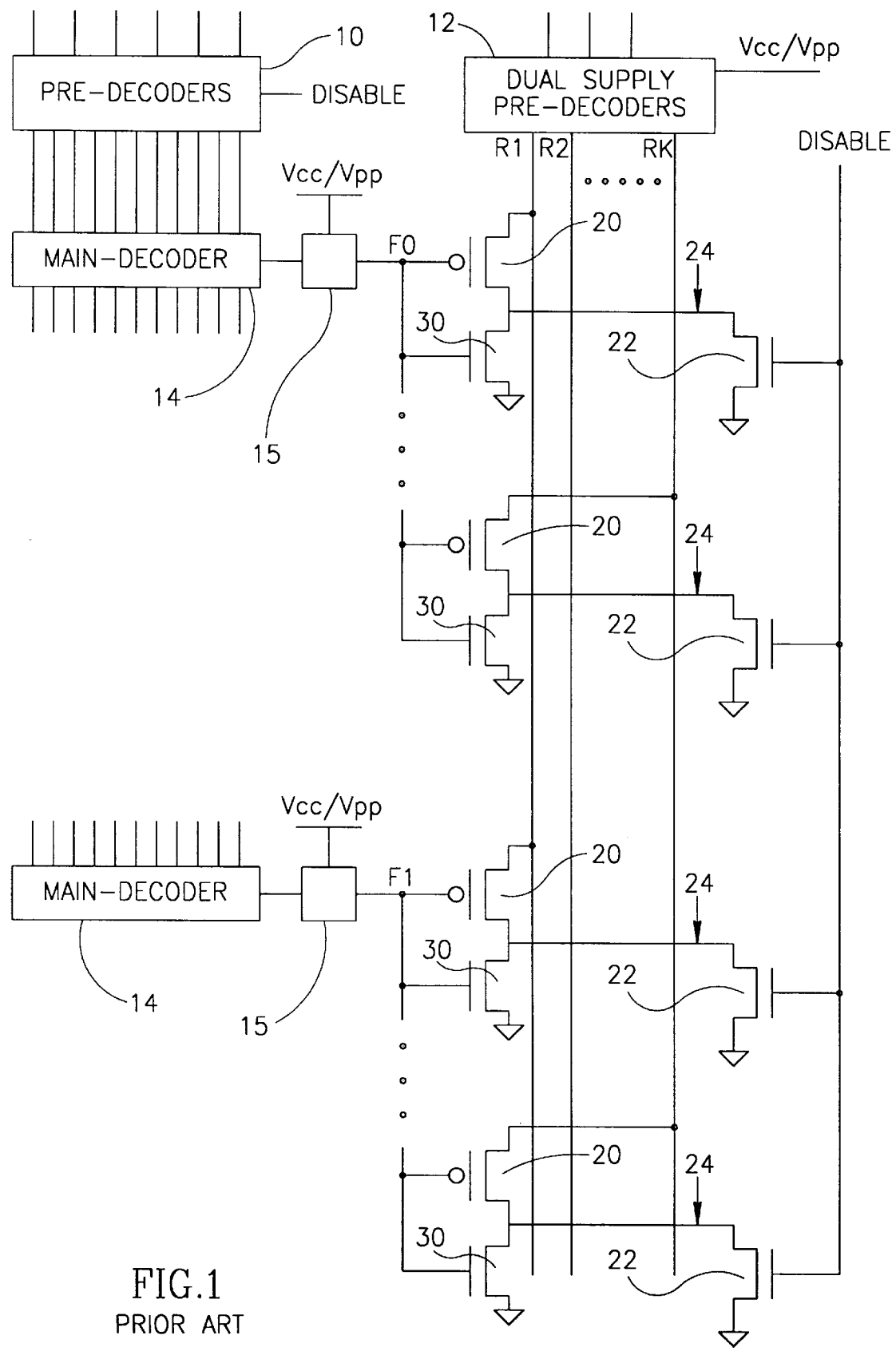
FIG. 1 is a schematic illustration of a prior art memory array with X decoders.
Figure 2:
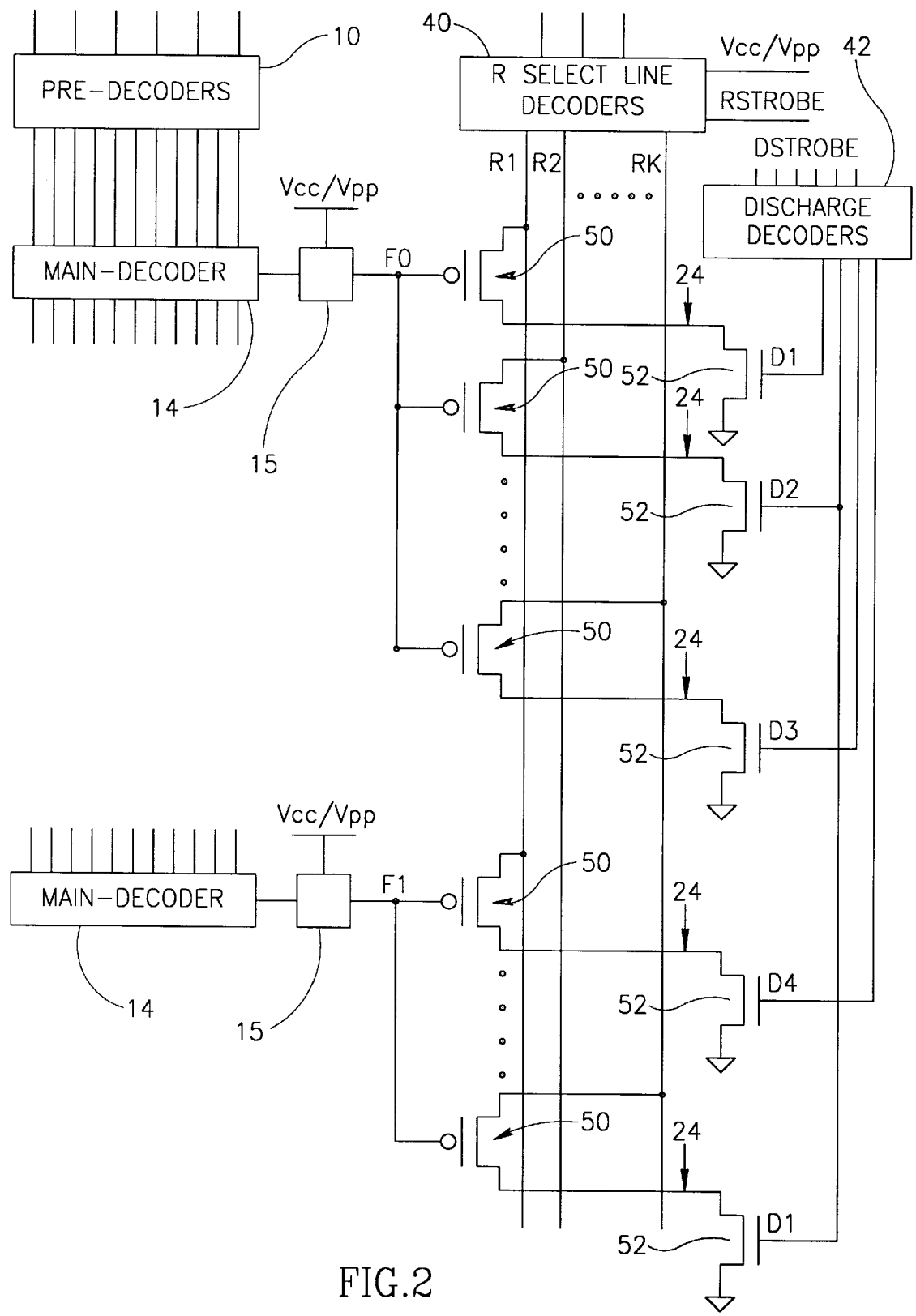
FIG. 2 is a schematic illustration of the elements of an array with a novel row decoder, constructed and operative in accordance with an embodiment of the present invention.

Reference is now made to FIG. 2 which illustrates an array having row decoders, constructed and operative in accordance with a preferred embodiment of the present invention.

The row decoder of FIG. 2 comprises pre-decoders 10 which receive the addresses to be accessed, strobed R select line decoders 40 capable of delivering both conventional voltages Vcc and high voltages Vpp, a plurality of main decoders 14 each associated with isolation elements 15, a multiplicity of word-line drivers, one per word-line and K per main decoder 14, and a discharging decoder 42.

Each word-line driver includes one p-channel, access transistor 50 and one n-channel, discharge transistor 52, each on opposite sides of their word-line, labeled 24. Each main decoder 14 supplies a control line Fx (where x ranges from 0 to J) to a block of access transistors 50 which, in response, access their associated word-lines 24. The R select line decoders 40 control the select lines Ry (where y ranges from 0 to K) which provide the voltages with which the accessed word-lines 24 are charged. In accordance with a preferred embodiment of the present invention and as described in more detail hereinbelow, the operation of the R select line decoders 40 are controlled by a strobed RSTROBE signal.

Discharge decoder 42 provides a delayed strobe DSTROBE signal to a selected group of discharge transistors 52 in accordance with the currently accessed address. In accordance with a preferred embodiment of the present invention and as will be described hereinbelow with respect to FIG. 6, the discharge transistors 52 are grouped to ensure that the word-lines 24 neighboring a word-line to be accessed are pulled to ground, thereby ensuring that there is no coupling of the signal on the accessed word-line onto its neighboring, non-accessed word-lines.

Figure 3A:
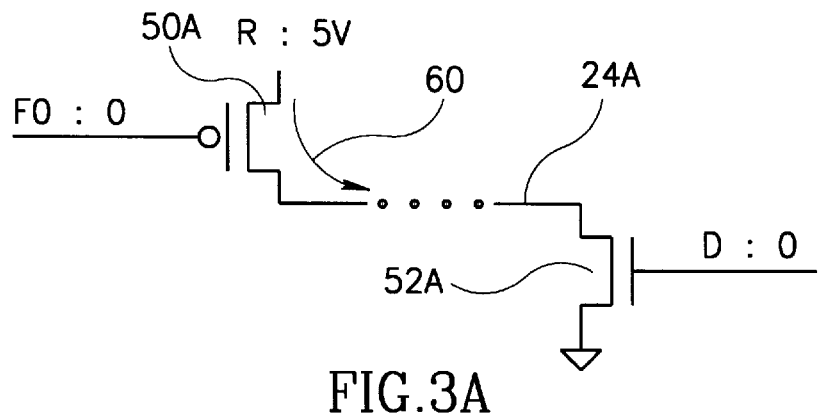
FIGS. 3A, 3B and 3C are schematic illustrations which indicate the flow of charge to and from a first selected word-line; 10
Figure 3B:
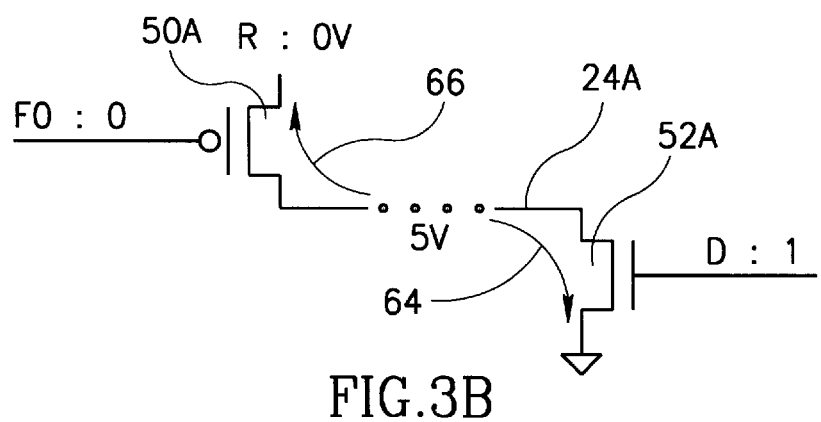
Figure 3C:
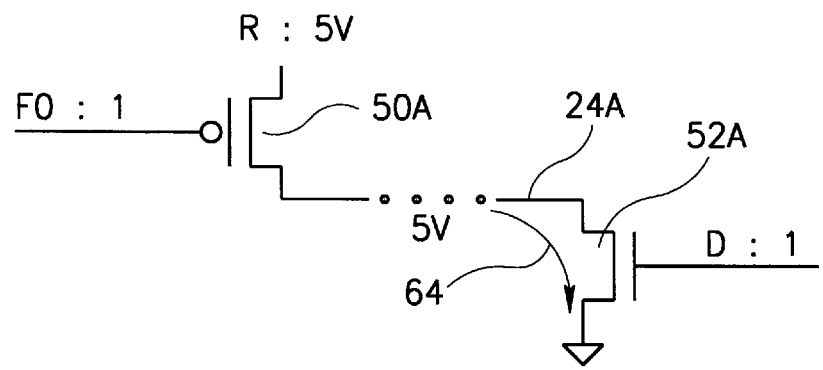
Figure 4A:
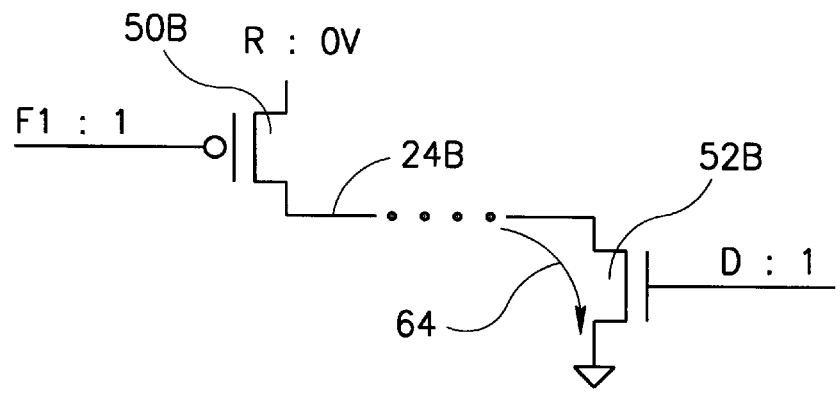
FIGS. 4A, 4B and 4C are schematic illustrations which indicate the flow of charge to and from a second word-line which is selected after the first word-line.
Figure 4B:
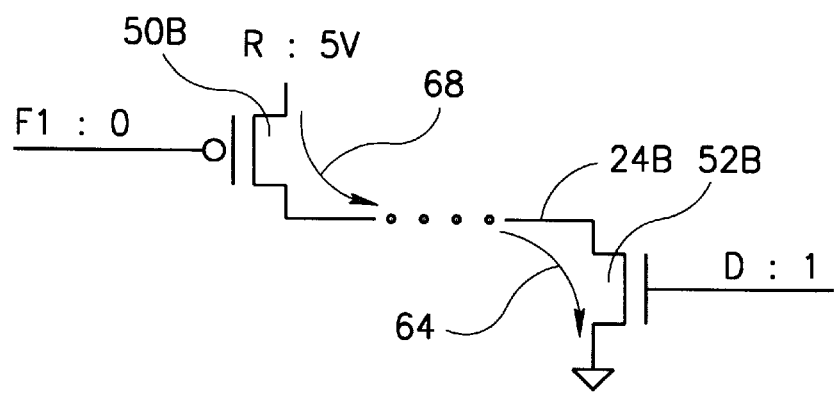
Figure 4C:
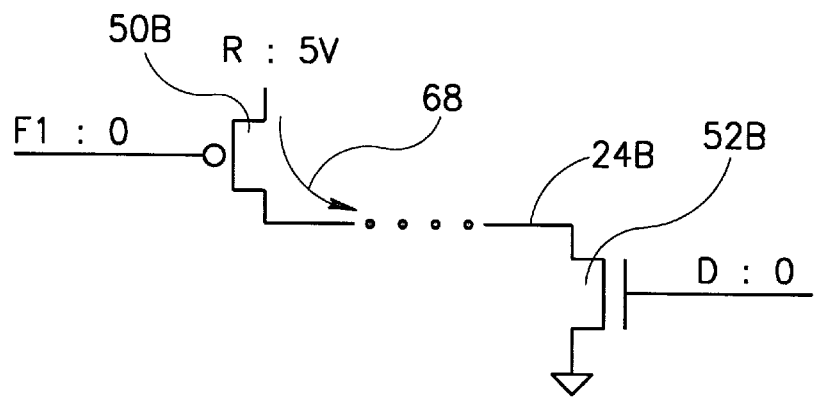
Figure 5:
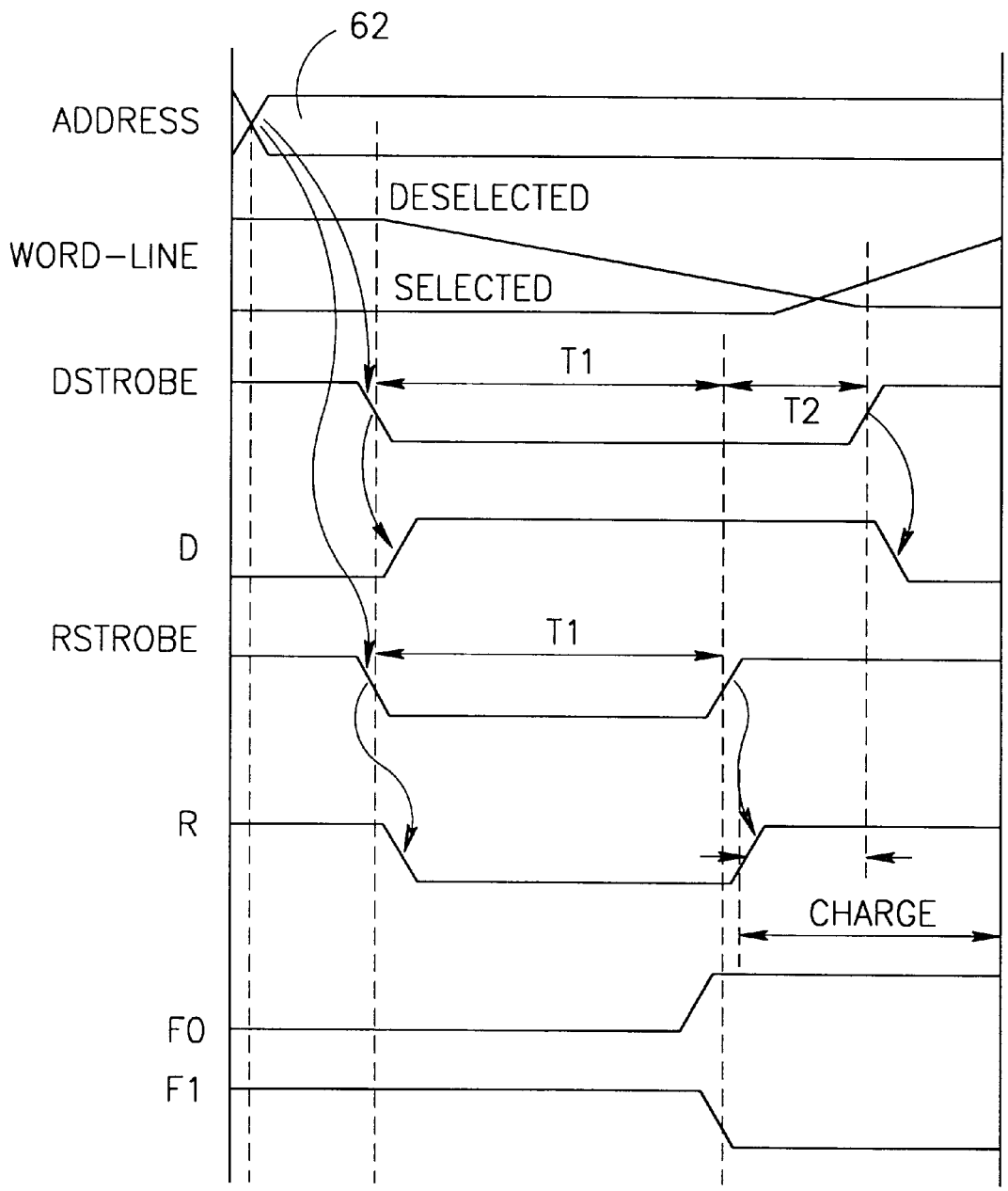
FIG. 5 is a graphical illustration which indicates the timing of the flow shown in FIGS. 3 and 4.

Reference is now made to FIGS. 3A, 3B, 3C, 4A, 4B, 4C and 5. FIGS. 3A, 3B and 3C indicate the flow of charge to and from a first selected word-line 24A and FIGS. 4A, 4B and 4C indicate the flow of charge to and from a second word-line 24B which is selected after the first word-line 24A. FIG. 5 indicates the timing of the flow shown in FIGS. 3 and 4.

In each figure, one word-line driver is shown having the access transistor 50 at one end of the word-line 24 and the discharge transistor 52 at the other end. The elements of FIG. 3 are labeled with an "A" while the elements of FIG. 4 are labeled with a "B". One select line, labeled R, provides voltages to both access transistors 50A and 50B. Since the two word-line drivers are parts of different blocks, two control lines, F0 and F1 are shown, controlling the gates of access transistors 50A and 50B, respectively. For simplicity, both word lines are assumed to part of the same disable group. Thus, a single disable line D is shown which controls the gates of both discharge transistors 52A and 52B.

As indicated by FIG. 3A, during charging of the first word-line 24A, the control line F0 and the disable line D carry a low value, indicated by a "0", and the select line R carries a high voltage, such as 5 V. The low value of control line F0 activates p-channel access transistor 50A to pass the high voltage of select line R to the word-line 24A. Since the low value of disable line D keeps the discharge transistor 52A off, the transferred voltage will flow only to the word-line 24A, thereby charging it. The flow of charge from the select line R to the word-line 24A is indicated by arrow 60.

When a new address 62 (FIG. 5), indicating word-line 24B, is received, word-line 24A must be discharged and word-line 24B must be charged. The address 62 causes the two strobe signals, RSTROBE and DSTROBE to go low.

The DSTROBE signal is inverted to create the disable signal D. Thus, shortly after the new address arrives, disable signal D becomes high, thereby activating discharge transistors 52A and 52B to discharge their respective word-lines 24A and 24B. The discharge action is shown in FIGS. 3B and 4A by arrows 64.

Because of significant delays in decoding the control signals F, the control lines F0 and F1 do not change state immediately upon receipt of the address signal. Thus, access transistor 50A of the previously selected word-line driver remains on during part of the time that the disable signals are active (i.e. discharging occurs). Furthermore, access transistor 50B of the newly selected word-line driver is not yet turned on.

The RSTROBE signal controls the select line R, causing it to become low at generally the same time that the disable signal D becomes high. For the previously selected word-line 24A (FIG. 3B), the low voltage level of select line R, combined with the still active access transistor 50A, provides a second discharge path, indicated by arrow 66.

It will be appreciated that the two discharge paths, 64 and 66 are on opposite ends of discharging word-line 24A, thereby dividing the word-line in two for discharging purposes. It will further be appreciated that access transistor 50A acts as both a charging and a discharging transistor.

For the about to be selected word-line (FIG. 4A), the control line F1 has not yet switched to the low state and thus, access transistor 50B remains off. Accordingly, discharge (arrow 64) of whatever charge might be thereon only occurs through the discharge transistor 52B, despite the low voltage level of the select line R.

Once control line F1 goes low (FIG. 4B), the state of select line R defines the charging or discharging state of newly selected word-line 24B. The RSTROBE signal returns to the high value after a period of length T1 while the DSTROBE signal remains low for a further, shorter period, T2. Because of decoding delays, the R signal becomes high after the RSTROBE signal returns to the high value.

Once control line F1 is low and the select line R is high, access transistor 50B charges the word-line 24B, as indicated by arrow 68 (FIG. 4B). Since, in accordance with a preferred embodiment of the present invention, the RSTROBE signal ends the discharge activity of the select line R before the DSTROBE signal ends its discharge activity, discharging continues through discharge transistor 52B, as shown by arrow 64 in FIG. 4B. However, since charging occurs at one end of word-line 24B and discharging occurs at the other end, the word-line 24B will begin to charge, albeit slowly. The charging speed is a function of the resistance and capacitance (RC) of the word-line.

When control line F1 goes low to activate the newly selected access transistor 50B, control line F0 goes high, to deactivate the previously selected access transistor 50A. However, as shown in FIG. 3C, discharging continues through discharge transistor 52A as long as disable line D is high. The length of period T2, after which DSTROBE ends the discharge operation, is a function of how low the voltage of a deselected word-line 24A should be and at what point the discharging operation impacts on the charging operation of selected word-line 24B.

As shown in FIG. 5, disable line D remains high during the periods T1 and T2, while DSTROBE indicates discharge. As will be described in more detail hereinbelow, because word-lines 24A and 24B are of the same disable group, disable line D follows the DSTROBE signal.

As will be described hereinbelow with respect to FIG. 6, the discharge signals are decoded to ensure that neighboring word-lines are controlled by different disable lines. This causes the neighbor of the word-line being charged to be pulled to ground and thus, ensures that there will be no coupling effects between neighboring word-lines.

Returning to the newly selected word-line 24B, charging continues after the DSTROBE signal ends the discharge period. FIG. 4C shows that the discharge transistor 52B is off and access transistor 50B is on, thereby providing the high voltage of select line R to the word-line 24B.

It will be appreciated that, in accordance with a preferred embodiment of the present invention, access transistors 50 provide both charging and discharging. Thus, in arrays which do not require fast discharge times, access transistors 50, by themselves, can form word-line drivers.

Figure 6:
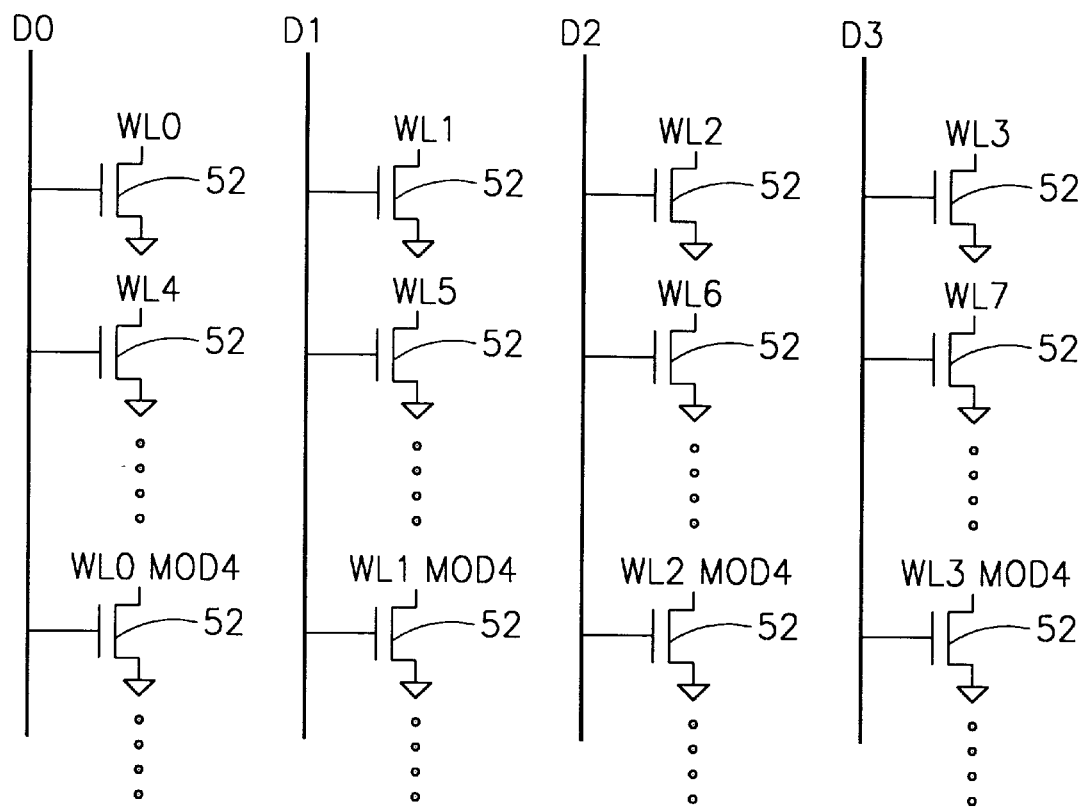
FIG. 6 is a schematic illustration which illustrates an exemplary arrangement of discharge transistors and disable lines so as to discharge together non-neighboring word-lines.
Figure 7A:
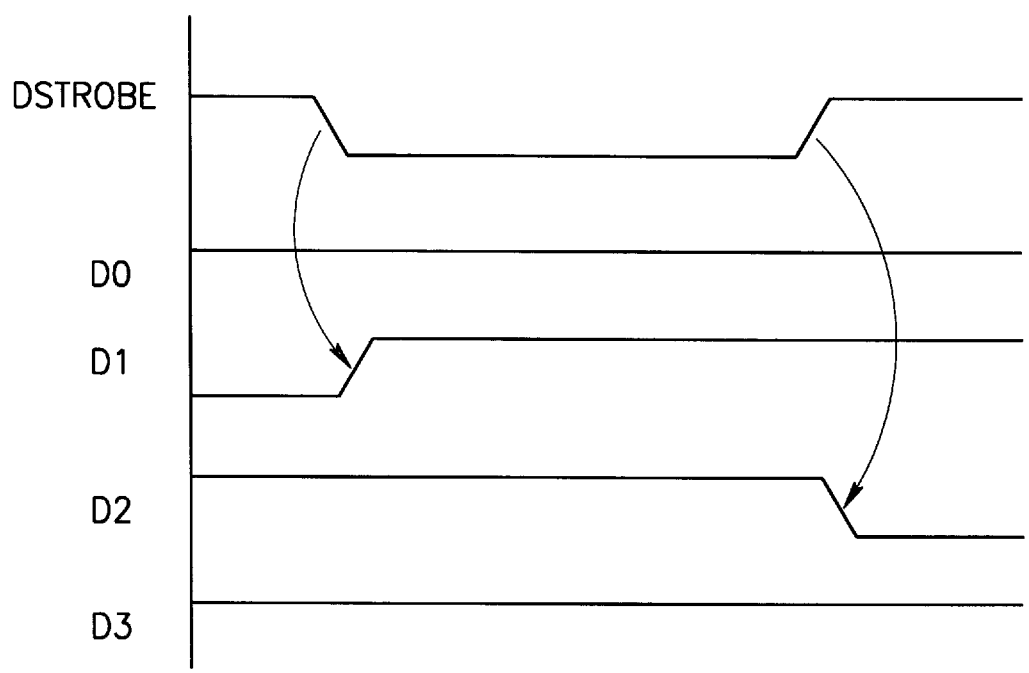
FIGS. 7A and 7B are timing diagrams of two activation sequences of the grouped disable lines of FIG. 6.
Figure 7B:
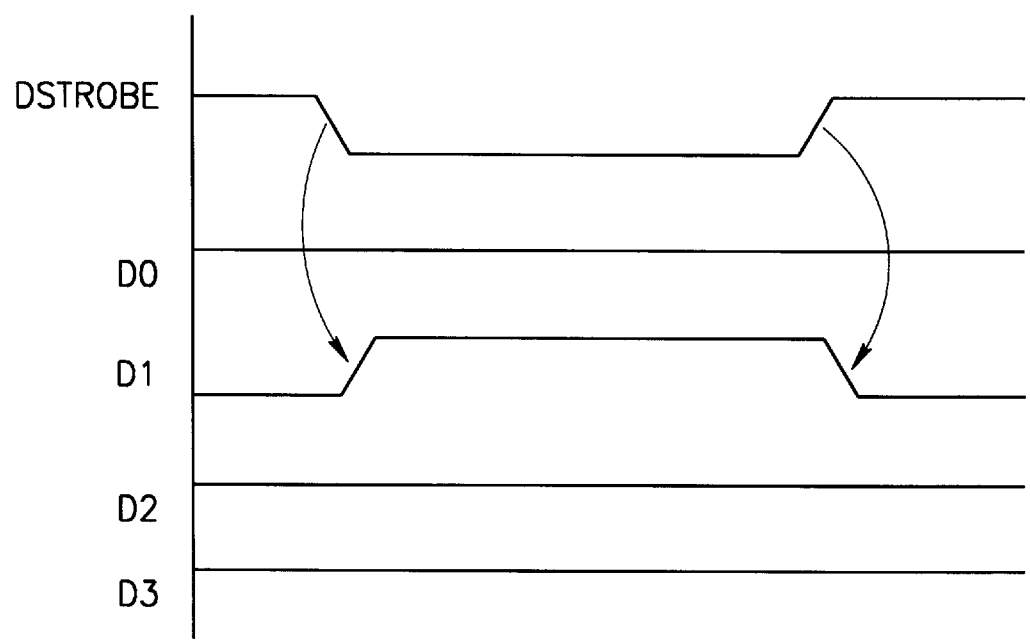

Reference is now made to FIG. 6 which illustrates an exemplary arrangement of the discharge transistors 52 and disable lines Di so as to discharge together non-neighboring word-lines. Reference is also made to FIGS. 7A and 7B which are exemplary timing diagrams of the operation of disable lines Di with respect to DSTROBE.

There are typically four disable lines, labeled D0, D1, D2 and D3, to which are connected every fourth word-line where the connection of a word-line to the disable line is based on the remainder when the word-line index number is divided by four. Thus, as shown in FIG. 6, disable line D0 is connected to the word-lines whose index number is divisible by four, disable line D1 is connected to the word-lines whose index number is equal to 1mod4, etc.

The discharge decoders 42 maintain all disable lines Di high except for the disable line associated with the currently selected word-line. In other words, only one-quarter of the discharge transistors 52 are not discharging at any given time. As discussed hereinabove, when a new address arrives, DSTROBE goes low. The previously inactive disable line, which is line D1 in FIGS. 7A and 7B, becomes high in response. The remaining disable lines stay high. Thus, all of the word-lines are discharging.

When the DSTROBE signal goes high again at the end of the period T1+T2, only the disable line associated with the newly selected word-line is deactivated. For FIG. 7A, the newly selected word-line is on disable line D2 and thus, only line D2 becomes low at the end of the period T1+T2. For FIG. 7A, the newly selected word-line is associated with previously active disable line D1 and thus, line D1 becomes low again.

Since the deactivated disable line (D2 in FIG. 7A and D1 in FIG. 7B) is not connected to any of the neighbors of the word-line being charged and since the neighboring word-lines are connected to ground via their still active disable lines, the neighboring word-lines do not float and thus, do not couple to the charging word-line.

It will be appreciated that, in the embodiment of FIG. 6, the discharge transistors 52 are spread out. For some array architectures, this extra real-estate can be costly. However, for array architectures with a very small pitch between word-lines, there is not enough room for the discharge transistors 52 between word-lines. For the latter architectures, the discharge transistors must be spread out anyway and thus, the grouping of the disable lines incurs no extra real-estate.

It will further be appreciated that any other grouping of the discharge transistors is possible and is incorporated into the present invention.

Figure 8:
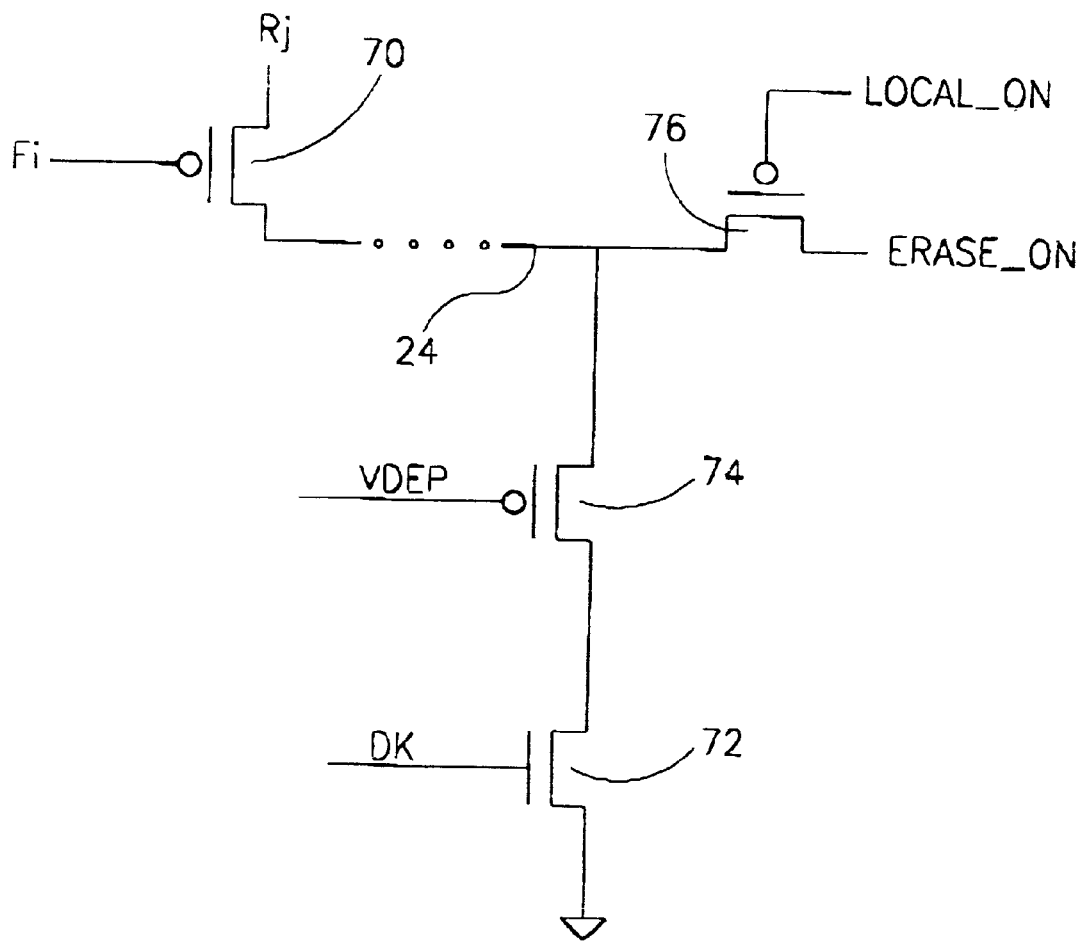
FIG. 8 is a schematic illustration of an alternative embodiment of the word-line drivers of the present invention for FLASH EPROM arrays.

Reference is now made to FIG. 8 which illustrates a word-line driver, using the principles of the present invention, for a FLASH EPROM array which has a global ERASE_ON signal and individual activation, via a LOCAL_ON signal, of each word-line. Such an array is described in the U.S. patent application Ser. No. 08/974,002 entitled "FLASH EPROM Array with Sub-Block Sized Redundant Sections", assigned to the common assignees of the present invention and filed on the same day herewith, and is incorporated herein by reference. The ERASE_ON signal carries an erasure voltage, such as of −11 V, and becomes active whenever erasure is desired. The LOCAL_ON signal is a control signal which becomes active only when the individual word-line is to be erased.

Similar to the previous embodiment, the word-line driver comprises an access transistor 70 at one end of the word-line 24 and a discharging transistor 72 at the other end of the word-line 24. Transistors 70 and 72 are controlled by the Fi, Rj and Dk signals and function as described hereinabove.

The word-line driver of FIG. 8 additionally includes a p-channel isolation device 74 and an erase device 76. Erase device 76 transfers the erase voltage of the ERASE_ON signal whenever the LOCAL_ON signal is active. P-channel isolation device 74 isolates discharge transistor 72 from the word-line whenever the ERASE_ON signal is active. Device 74 is controlled by a VDEP signal which is high whenever the ERASE_ON signal is active.

It will be appreciated by persons skilled in the art that the present invention is not limited by what has been particularly shown and described hereinabove. Rather the scope of the invention is defined by the claims that follow:

We claim:

1. A word-line driver for charging and discharging a word-line, the driver comprising:
   an access transistor located at one end of said word-line for charging and discharging said word-line; and
   a discharge transistor located at a second end of said word-line for discharging said word-line.

2. A word-line driver for charging and discharging a word-line, the driver comprising:
   an access transistor located at one end of said word-line, which is controlled by a control line and is connected between a select line and said word-line, wherein said control line carries a control signal which is active during a charge period and during a portion of a discharge period and said select line carries a voltage which is high during said charge period and low during said discharge period; and
   a discharge transistor located at a second end of said word-line which is controlled by a disable signal and is connected between said word-line and a ground supply, wherein said disable signal is active during all of said discharge period.

3. A row decoder for controlling a plurality of selectable word-lines, the row decoder comprising:
   a plurality of main decoders, wherein each main decoder is connected to a block of N word-lines via a control line, wherein each said main decoder selectably activates its control line during a charge period and during a portion of a discharge period;
   K select line decoders which are connected to K select lines, wherein each select line decoder selectably provides a high voltage to its associated select line during said charge period and a low voltage during most of said discharge period;
   at least one discharge decoder which is connected to a disable line, wherein said discharge decoder activates its disable line at least during said discharge period;
   one word-line driver per word-line, wherein each driver includes:
     an access transistor located at one end of its word-line which is controlled by one control line and is connected between one select line and said word-line; and
     a discharge transistor located at a second end of said word-line which is controlled by one disable signal and is connected between said word-line and a ground supply.

4. A row decoder according to claim 3 and wherein said at least one discharge decoder ensures that word-lines which neighbor a selected word-line have generally no charge on them during said charge period.

5. A row decoder according to claim 3 and wherein said at least one discharge decoder is M discharge decoders each connected to its own disable line which is connected to every Mth word-line, wherein the M disable lines are not connected to the same word-lines.

6. A row decoder according to claim 5 and wherein at the end of said discharge period, said M discharge decoders deactivate only the disable line connected to a currently selected word-line.

7. A row decoder according to claim 3 wherein said select decoder is connected to an RSTROBE strobe line and said discharge decoders are connected to a DSTROBE strobe line and wherein said strobe lines control the changes in voltage on said select and disable lines, respectively.

8. A row decoder according to claim 7 and wherein said RSTROBE strobe line responds to an address signal at the same time as said DSTROBE strobe line but returns to its previous state before said DSTROBE strobe line does.

9. A row decoder according to claim 3 and wherein said charge period begins before said discharge period ends.

10. A method of operating a dual transistor word-line driver, the driver having an access transistor which is controlled by a control line and connected between a select line and a beginning of a word-line and a discharge transistor which is controlled by a disable line and connected between an end of the word-line and a ground supply, the method comprising the steps of:
   to charge said word-line:
     activating said access transistor during a charge period and providing a high voltage on said select line, thereby to charge said word-line with voltage from said select line;

to discharge said word-line:
  activating said access transistor during a first portion of a discharge period and providing a low voltage on said select line while also activating said discharge transistor during all of said discharge period thereby to discharge said word-line towards said select line, during said first portion, and towards said ground supply during all of said discharge period.

* * * * *